US010505438B2

(12) United States Patent
Sakaguchi

(10) Patent No.: US 10,505,438 B2
(45) Date of Patent: Dec. 10, 2019

(54) OVERCURRENT PROTECTION CIRCUIT AND VOLTAGE REGULATOR

(71) Applicant: ABLIC Inc., Chiba-shi, Chiba (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/939,964

(22) Filed: Mar. 29, 2018

(65) Prior Publication Data

US 2018/0287485 A1    Oct. 4, 2018

(30) Foreign Application Priority Data

Mar. 31, 2017  (JP) ................................. 2017-072219

(51) Int. Cl.
| | |
|---|---|
| H02M 1/32 | (2007.01) |
| H02M 3/156 | (2006.01) |
| H02H 1/00 | (2006.01) |
| H02M 1/08 | (2006.01) |
| H03K 17/082 | (2006.01) |
| H02H 9/02 | (2006.01) |

(52) U.S. Cl.
CPC ............ H02M 1/32 (2013.01); H02H 1/0007 (2013.01); H02M 1/08 (2013.01); H02M 3/156 (2013.01); H03K 17/0822 (2013.01); H02H 9/02 (2013.01); H03K 2217/0027 (2013.01)

(58) Field of Classification Search
CPC ...................................................... H02M 1/32
See application file for complete search history.

(56) References Cited

U.S. PATENT DOCUMENTS

| | | | |
|---|---|---|---|
| 2008/0136398 A1 | 6/2008 | Nakashimo | |
| 2012/0087053 A1* | 4/2012 | Mizui | G05F 1/573 361/93.7 |
| 2013/0249599 A1* | 9/2013 | Sakaguchi | H03K 17/081 327/53 |
| 2015/0002131 A1* | 1/2015 | Takada | H03F 3/345 323/313 |
| 2017/0220058 A1* | 8/2017 | Petenyi | G05F 1/575 |

FOREIGN PATENT DOCUMENTS

JP        2008-117176 A        5/2008

* cited by examiner

*Primary Examiner* — Jue Zhang
*Assistant Examiner* — Trinh Q Dang
(74) *Attorney, Agent, or Firm* — Brinks Gilson & Lione

(57) ABSTRACT

There is provided an overcurrent protection circuit having a sense transistor through which a first sense current proportional to an output current of an output transistor flows, a voltage-current converting circuit connected between an input terminal of the output transistor and an output terminal thereof, and configured to output a first current, a first current-voltage converting circuit configured to output a first voltage proportional to the first current, a voltage detection circuit configured to detect the first voltage and to output a second sense current based on the output current of the output transistor, a second current-voltage converting circuit through which the first sense current and the second sense current flow, and a current limiting circuit configured to limit the output current of the output transistor based on a second voltage supplied from the second current-voltage converting circuit.

10 Claims, 7 Drawing Sheets

OVERCURRENT PROTECTION CIRCUIT AND VOLTAGE REGULATOR

RELATED APPLICATIONS

This application claims priority under 35 U.S.C. § 119 to Japanese Patent Application No. 2017-072219 filed on Mar. 31, 2017, the entire content of which is hereby incorporated by reference.

BACKGROUND OF THE INVENTION

Field of the Invention

The present invention relates to an overcurrent protection circuit which protects a transistor from an overcurrent, and a voltage regulator.

Background Art

FIG. 7 is a circuit diagram of a voltage regulator having a related art overcurrent protection circuit.

The voltage regulator having the related art overcurrent protection circuit controls a voltage Vin of a voltage input terminal 10 to control a gate of a controlling transistor 12 through a transistor control circuit 13 in such a manner that a voltage Vout of a voltage output terminal 11 becomes a predetermined voltage value. A voltage dividing resistance circuit 14 divides the voltage Vout into a voltage Vp and supplies the same to a non-inverting input terminal of an error amplifier 31. The error amplifier 31 outputs a gate voltage Va for the controlling transistor 12, based on the difference between the divided voltage Vp and the reference voltage Vref supplied from the reference voltage source 32.

The overcurrent protection circuit 15 operates so as to limit the current flowing through the controlling transistor 12. Specific operations thereof are as follows:

When a short-circuit failure occurs in a load connected to the voltage output terminal 11, the voltage Vout becomes 0V and hence an output current Iout of the controlling transistor 12 increases. A transistor 41 supplies a sense current proportional to the output current Iout into a resistor 42. When the voltage generated across the resistor 42 reaches a threshold voltage of an inverter circuit 43, the inverter circuit 43 turns on a transistor 44. When the transistor 44 turns on, the gate voltage Va of the controlling transistor 12 is controlled to limit the output current Iout of the controlling transistor 12. Further, when the voltage Vin becomes high, a current flowing through a resistor 45 increases. A current mirror composed of transistors 46 and 47 supplies a current proportional to the current flowing through the resistor 45 to the resistor 42. Thus, when the voltage Vin is high, the voltage generated at the resistor 42 becomes high, so that the voltage generated across the resistor 42 reaches the threshold voltage of the inverter circuit 43 by a sense current smaller than that in the case when the voltage Vin is low. Accordingly, the higher the voltage Vin becomes, the smaller the output current Iout of the controlling transistor 12 is restricted (refer to, for example, Japanese Patent Application Laid-Open No. 2008-117176).

SUMMARY OF THE INVENTION

However, the related art overcurrent protection circuit has a tendency to restrict the output current excessively only when the input voltage Vin is high even though the between the input/output voltage difference is small. Further, since the related art overcurrent protection circuit limits the output current Iout by the current flowing through the resistor 45 when the voltage Vin is high, limitation of the current value is affected by variations in the resistance value of the resistor 45.

The present invention has been made to provide an overcurrent protection circuit and a voltage regulator capable of accurately detecting excessive power generated in a controlling transistor and limiting current.

According to an embodiment of the present invention, an overcurrent protection circuit of the present invention includes a sense transistor through which a first sense current proportional to an output current of an output transistor flows, a voltage-current converting circuit connected between an input terminal of the output transistor and an output terminal thereof, and configured to output a first current, a first current-voltage converting circuit configured to output a first voltage proportional to the first current, a voltage detection circuit configured to detect the first voltage, and to output a second sense current based on the output current of the output transistor, a second current-voltage converting circuit through which the first sense current and the second sense current flow, and a current limiting circuit configured to limit the output current of the output transistor, based on a second voltage supplied from the second current-voltage converting circuit.

According to an overcurrent protection circuit of the present invention, since the overcurrent protection circuit including a voltage-current converting circuit connected between an input terminal of an output transistor and an output terminal thereof, excessive power generated in the output transistor can be accurately detected based on a first current supplied from the voltage-current converting circuit. It is thus possible to limit an output current of the output transistor, based on the excessive power.

DETAILED DESCRIPTION OF THE EMBODIMENTS

Figure 1:
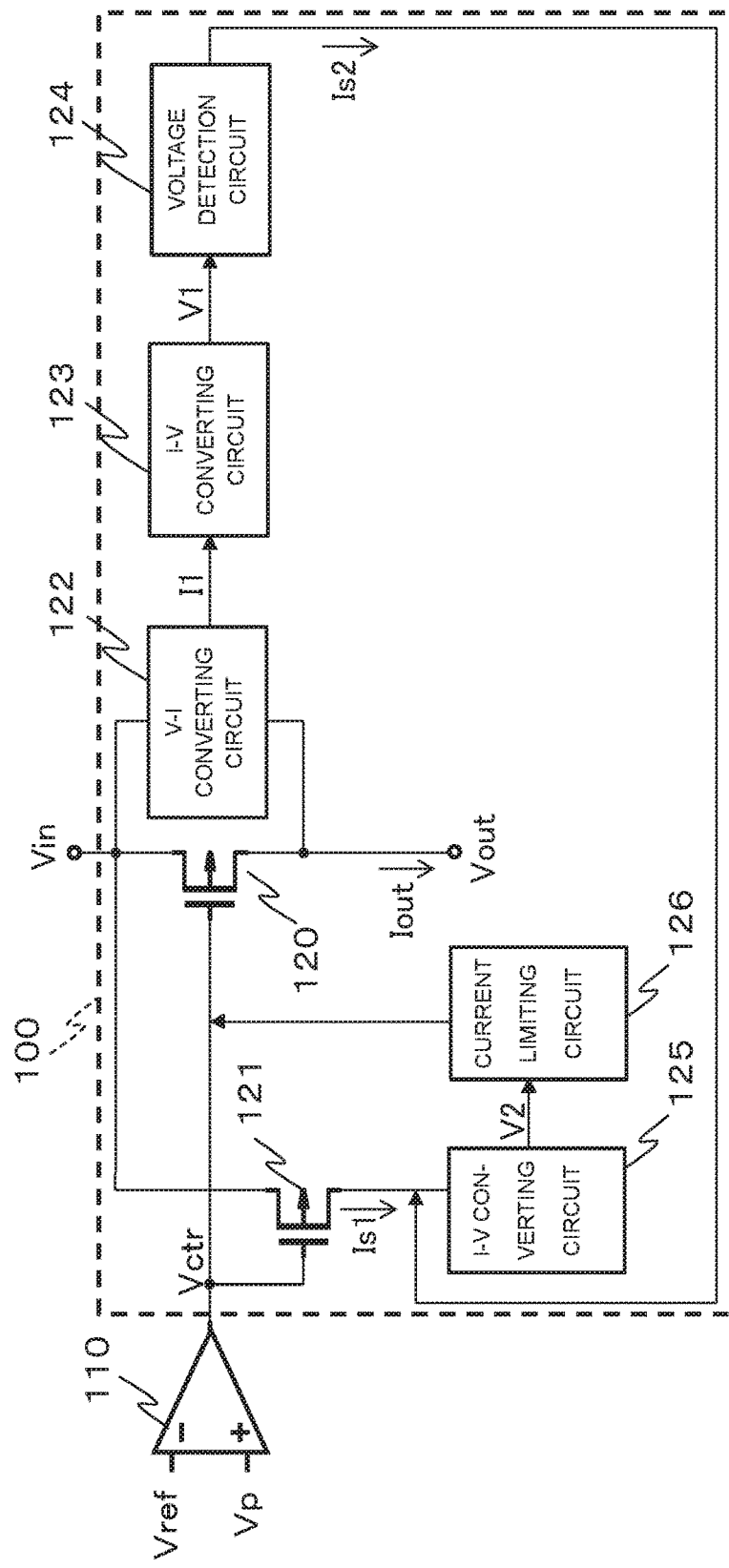
FIG. 1 is a block diagram of a voltage regulator having an overcurrent protection circuit according to a first embodiment.

FIG. 1 is a block diagram of a voltage regulator having an overcurrent protection circuit according to a first embodiment.

The voltage regulator having the overcurrent protection circuit 100 according to the first embodiment includes an error amplifier 110, an output transistor 120, and the overcurrent protection circuit 100.

The overcurrent protection circuit 100 has a sense transistor 121, a voltage-current converting circuit 122, a current-voltage converting circuit 123, a voltage detection circuit 124, a current-voltage converting circuit 125, and a current limiting circuit 126.

The output transistor 120 has a source connected to an input terminal of the voltage regulator, a drain connected to an output terminal of the voltage regulator, and a gate connected to an output terminal of the error amplifier 110. The output transistor 120 supplies a current Iout to an external load connected to the output terminal of the voltage regulator.

The sense transistor 121 has a source and a gate respectively connected to the source and gate of the output transistor 120, and a drain connected to the current-voltage converting circuit 125 (I-V converting circuit 125 in FIG. 1). The sense transistor 121 outputs a sense current Is1 proportional to the current Iout supplied from the output transistor 120 to the current-voltage converting circuit 125.

The voltage-current converting circuit 122 (V-I converting circuit 122 in FIG. 1) is connected to the input terminal and output terminal of the voltage regulator and outputs a current I1 proportional to a difference between a voltage Vin and a voltage Vout to the current-voltage converting circuit 123 (I-V converting circuit 123 in FIG. 1). The current-voltage converting circuit 123 outputs a voltage V1 proportional to the current I1 to the voltage detection circuit 124. When the voltage detection circuit 124 detects that the voltage V1 is greater than or equal to a prescribed detection voltage Vdet1, the voltage detection circuit 124 outputs a sense current Is2 proportional to the current Tout supplied from the output transistor 120 to the current-voltage converting circuit 125. The current-voltage converting circuit 125 is provided with the sense current Is1 of the sense transistor 121 and the sense current Is2 of the voltage detection circuit 124 and outputs a voltage V2 proportional to those currents to the current limiting circuit 126. When the voltage V2 becomes greater than or equal to a prescribed detection voltage Vdet2, the current limiting circuit 126 controls a gate voltage of the output transistor 120 and thereby limits the output current Iout to a desired limit current.

Power P expressed by an equation 1 is generated in the output transistor 120 by the voltage Vin of the input terminal and the voltage Vout of the output terminal:

$$P=(Vin-Vout) \times Iout \tag{1}$$

The sense current Is1 flowing through the sense transistor 121 is expressed by an equation 2:

$$Is1 = A \times Iout \tag{2}$$

The current I1 supplied from the voltage-current converting circuit 122 is expressed by an equation 3:

$$I1 = B \times (Vin-Vout) \tag{3}$$

The voltage V1 supplied from the current-voltage converting circuit 123 is expressed by an equation 4:

$$V1 = C \times I1 \tag{4}$$

The sense current Is2 supplied from the voltage detection circuit 124 when V1>Vdet1 is expressed by an equation 5:

$$Is2 = D \times Iout \tag{5}$$

The voltage V2 supplied from the current-voltage converting circuit 125 is expressed by an equation 6:

$$V2 = E \times (Is1+Is2) \tag{6}$$

where A, B, C, D, and E are respectively a positive constant determined by circuit constants.

<Limit current Ilim when the input/output voltage difference (Vin−Vout) is small>

When the current I1, i.e., the voltage V1 is smaller than the detection voltage Vdet1, the sense current Is2 supplied from the voltage detection circuit 124 becomes zero. A limit current Ilim1 of the output transistor 120 is determined by a condition under which the voltage V2 becomes equal to the detection voltage Vdet2:

$$Ilim1 = Vdet2/A/E \tag{7}$$

<Limit current Ilim when the input/output voltage difference (Vin−Vout) is large>

When the current I1, i.e., the voltage V1 becomes greater than or equal to the detection voltage Vdet1, the sense current Is2 starts to flow from the voltage detection circuit 124. At this time, a limit current Ilim2 of the output transistor 120 is determined by a condition under which the voltage V2 becomes equal to the detection voltage Vdet2:

$$Ilim2 = Vdet2/(A+D)/E \tag{8}$$

From the equations 7 and 8, Ilim1>Ilim2 is established.

As described above, when the overcurrent protection circuit 100 is used, it is able to limit the output current Iout based on the detection that the input/output voltage difference (Vin−Vout) becomes large. It is therefore possible to prevent thermal damage of the output transistor 120 due to the excessive power and to prevent excessive limitation of the current output capability of the voltage regulator.

Figure 2:
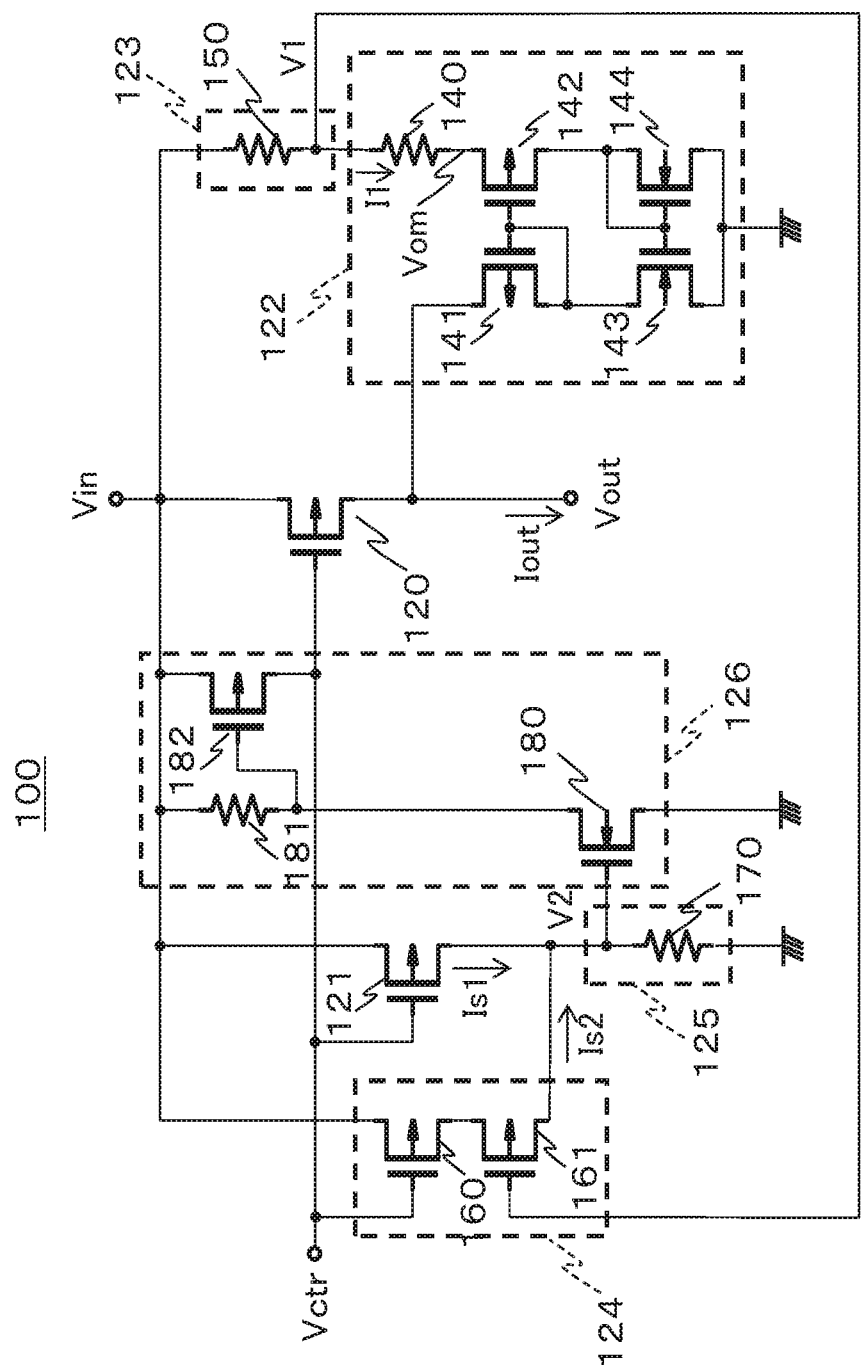
FIG. 2 is a circuit diagram illustrating one example of the overcurrent protection circuit according to the first embodiment.

FIG. 2 is a circuit diagram illustrating one example of the overcurrent protection circuit 100 according to the first embodiment.

For convenience of description, an output transistor 120 is included in the overcurrent protection circuit 100 in the illustration.

A voltage-current converting circuit 122 has a resistor 140, PMOS transistors 141 and 142, and NMOS transistors 143 and 144.

The PMOS transistor 141 has a source connected to an output terminal of a voltage regulator and a gate and a drain connected to a gate of the PMOS transistor 142 and a drain of the NMOS transistor 143. The NMOS transistor 143 has a source connected to a ground terminal, and a gate connected to a gate and a drain of the NMOS transistor 144 and a drain of the PMOS transistor 142. The NMOS transistor 144 has a source connected to the ground terminal. The PMOS transistor 142 has a source connected to one terminal of the resistor 140. The other terminal of the resistor 140 is connected to an output terminal of the voltage-current converting circuit 122.

A current-voltage converting circuit 123 has a resistor 150.

The resistor 150 is connected between input and output terminals of the current-voltage converting circuit 123.

A voltage detection circuit 124 has PMOS transistors 160 and 161.

The PMOS transistor 161 has a gate connected to an input terminal of the voltage detection circuit 124, a source connected to a drain of the PMOS transistor 160, and a drain connected to an output terminal of the voltage detection circuit 124. The PMOS transistor 160 has a gate connected to a terminal Vctr and a source connected to an input terminal of the voltage regulator.

A current-voltage converting circuit 125 has a resistor 170.

The resistor 170 has one terminal connected to the output terminal of the voltage detection circuit 124 and an output terminal of the current-voltage converting circuit 125, and the other terminal connected to the ground terminal.

A current limiting circuit 126 has an NMOS transistor 180, a resistor 181, and a PMOS transistor 182.

The NMOS transistor 180 has a gate connected to an input terminal of the current limiting circuit 126, a drain connected to one terminal of the resistor 181, and a source connected to the ground terminal. The PMOS transistor 182 has a gate connected to one terminal of the resistor 181, a source connected to the input terminal of the voltage regulator, and a drain connected to the terminal Vctr.

In the voltage-current converting circuit 122, the NMOS transistors 143 and 144 configure a current mirror. When a size ratio between the NMOS transistors 143 and 144 and a size ratio between the PMOS transistors 141 and 142 are equal to each other, gate-source voltages Vgs of the PMOS transistors 141 and 142 are equal to each other. Thus, a voltage Vom of the source of the PMOS transistor 142 coincides with a voltage Vout of the output terminal of the voltage regulator. Since the voltage equivalent to the input/output voltage difference (Vin−Vout) is applied across a series resistor of the resistors 140 and 150, a current I1 supplied from the voltage-current converting circuit 122 has a current value proportional to the input/output voltage difference (Vin−Vout). A voltage V1 supplied from the current-voltage converting circuit 123 is generated across the resistor 150 and is as given by the equation 4. Assuming that the resistance values of the resistors 140 and 150 are respectively R140 and R150, the constant B in the equation 3 becomes equal to 1/(R140+R150), and the constant C in the equation 4 becomes equal to the resistance value R140, respectively.

When the input/output voltage difference (Vin−Vout) is relatively small, the difference between the voltages V1 and Vin is small and does not reach the threshold value of the PMOS transistor 161. Thus, the PMOS transistor 161 keeps off. In that case, only a sense current Is1 flows through the resistor 170. Assuming that the resistance value of the resistor 170 is R170, the constant E in the equation 6 is equal to the resistance value R170.

When the voltage V2 generated at the resistor 170 reaches the threshold value of the NMOS transistor 170, the NMOS transistor 180 turns on so that the voltage is generated across the resistor 181. When the voltage applied across the resistor 181 reaches the threshold value of the PMOS transistor 182, the PMOS transistor 182 turns on to limit an output current Iout of the output transistor 120. At this time, a limit current Ilim1 is expressed by the equation 7 (Ilim1=Vdet2/A/E).

When the difference between the voltages V1 and Vin reaches the threshold value of the PMOS transistor 161 where the input/output voltage difference (Vin−Vout) is relatively large, the PMOS transistor 161 turns on. When the PMOS transistor 161 turns on, a sense current Is2, proportional to the output current of the output transistor 120, flows through the resistor 170 by means of the PMOS transistor 160. At this time, a limit current Ilim2 is expressed by the equation 8 (Ilim2=Vdet2/(A+D)/E).

Here, the difference between the voltages V1 and Vin is given by an equation 9:

$$Vin-V1=R150/(R140+R150)\times(Vin-Vout) \quad (9)$$

A ratio in resistance value between resistors formed on a monolithic IC is relatively high in precision in the same manufacturing process and hardly affected by characteristic variations in the resistance value. Thus, the voltage V1 is able to obtain a voltage precisely proportional to the input/output voltage difference (Vin-Vout). It is possible to precisely set the condition at which the PMOS transistor 161 begins to turn on, and the limit current begins to change from Ilim1 to Ilim2. Further, since the value of R150/(R140+R150) in the equation 9 can be easily changed by the size setting of the resistor, condition for the input/output voltage difference (Vin−Vout) at which the limit current becomes small can be freely set.

In the present example, the detection voltage Vdet1 is determined by the threshold value of the PMOS transistor 161. Also, the detection voltage Vdet2 is determined by the threshold value of the NMOS transistor 180. Further, the constant A in the equation 2 is determined by a size ratio between the output transistors 120 and 121. Also, the constant D in the equation 5 is determined by a size ratio between the output transistors 120 and 160.

Thus, since the use of the overcurrent protection circuit 100 makes it possible to limit the output current Iout along with the detection that the input/output voltage difference (Vin−Vout) becomes relatively large, it is possible to prevent thermal damage of the output transistor 120 due to excessive power and prevent excessive limitation of the current output capability of the voltage regulator.

Figure 3:
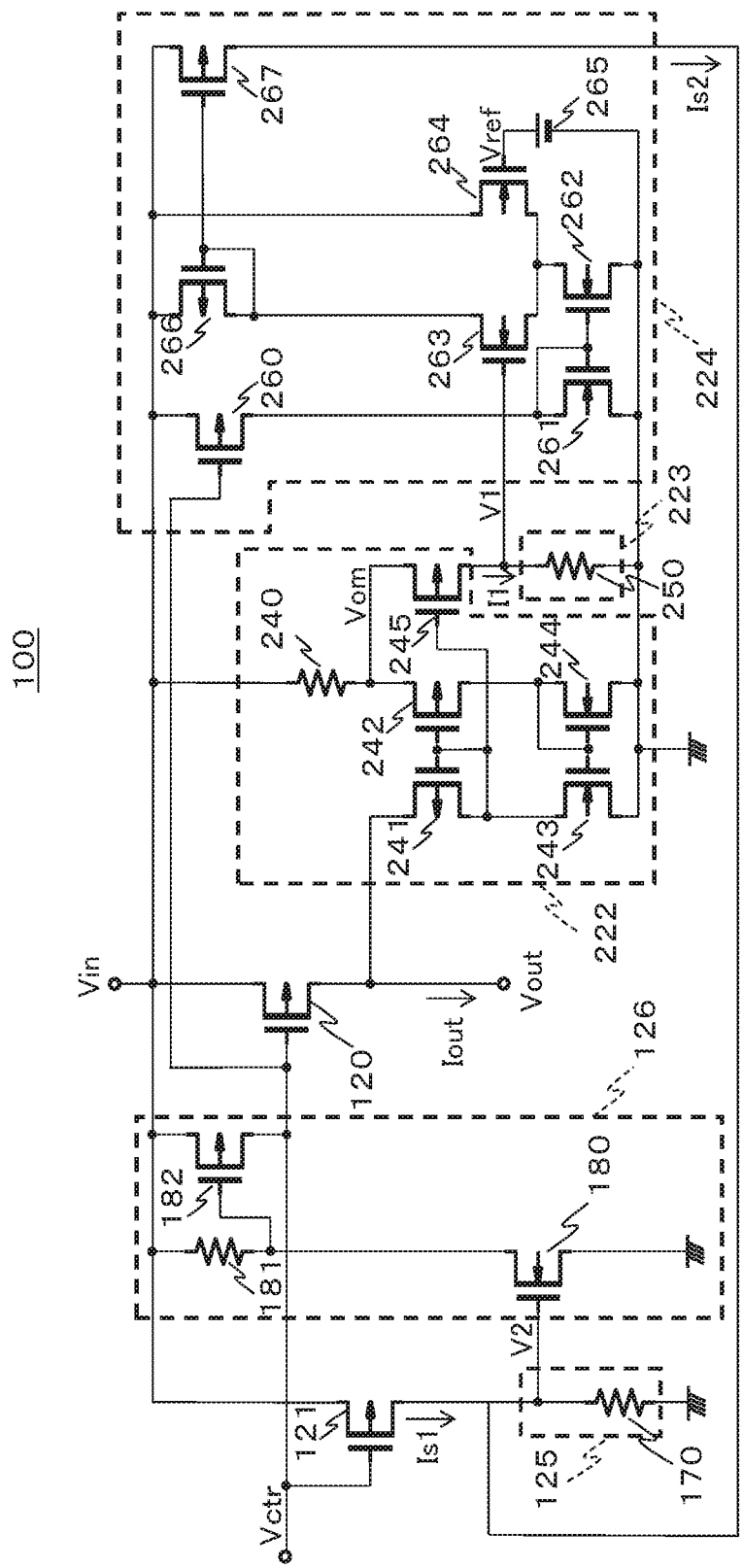
FIG. 3 is a circuit diagram illustrating another example of the overcurrent protection circuit according to the first embodiment.

FIG. 3 is a circuit diagram illustrating another example of the overcurrent protection circuit 100 according to the first embodiment.

In the overcurrent protection circuit of FIG. 3, the same parts as those in FIG. 2 will not be described.

A voltage-current converting circuit 222 has a resistor 240, PMOS transistors 241, 242, and 245, and NMOS transistors 243 and 244.

The PMOS transistors 241 and 242, the NMOS transistors 243 and 244, and the resistor 240 are connected as with the PMOS transistors 141 and 142, the NMOS transistors 143 and 144, and the resistor 140 in FIG. 2. The PMOS transistor 245 has a gate connected to gates of the PMOS transistors 241 and 242, a source connected to a source of the PMOS transistor 242, and a drain connected to one terminal of a resistor 250.

A current-voltage converting circuit 223 has the resistor 250.

A voltage detection circuit 224 has PMOS transistors 260, 266, and 267, NMOS transistors 261, 262, 263, and 264, and a reference voltage source 265.

The PMOS transistor 260 has a source connected to an input terminal of a voltage regulator, a gate connected to a terminal Vctr, and a drain connected to a drain and a gate of the NMOS transistor 261 and a gate of the NMOS transistor 262. Sources of the NMOS transistors 261 and 262 are connected to a ground terminal. The NMOS transistor 262 has a drain connected to sources of the NMOS transistors 263 and 264. The NMOS transistor 263 has a drain connected to a drain and a gate of the PMOS transistor 266 and a gate of the PMOS transistor 267. The NMOS transistor 264 has a gate connected to one terminal of the reference voltage source 265 and a drain connected to the input terminal of the voltage regulator. Sources of the PMOS transistors 266 and 267 are connected to the input terminal of the voltage regulator. The PMOS transistor 267 has a drain connected to one terminal of a resistor 170.

Since the operation of the voltage-current converting circuit 222 is the same as that of the voltage-current converting circuit 122 of FIG. 2 except for the PMOS transistor 245, its description will be omitted.

A current flowing through the PMOS transistors 242 and 245 becomes a current value proportional to an input/output voltage difference (Vin–Vout). When the PMOS transistors 242 and 245 both operate in a saturated state, an output current I1 of the voltage-current converting circuit 222 which is supplied from the PMOS transistor 245 becomes a current value obtained by dividing a current flowing through the resistor 240 by a size ratio between the PMOS transistors 242 and 245.

A voltage V1 supplied from the current-voltage converting circuit 223 is generated across the resistor 250 and is given by the equation 4. Assuming that the resistance value of the resistor 240 is R240, the constant B in the equation 3 becomes 1/R240. Further, assuming that the resistance value of the resistor 250 is R250, the constant C in the equation 4 (V1=C×I1) is determined depending on the resistance value R250 and the size ratio between the PMOS transistors 242 and 245.

When the input/output voltage difference (Vin–Vout) is relatively small, the voltage V1 is lower than a reference voltage Vref supplied from the reference voltage source 265. When the voltage V1 is lower than the reference voltage Vref, a differential pair composed of the NMOS transistors 263 and 264 causes a current to flow to the NMOS transistor 264. Then, a sense current Is2 supplied from a current mirror comprised of the PMOS transistors 266 and 267 becomes zero, and hence only a sense current Is1 flows through the resistor 170. As with the case of FIG. 2, at this time, a limit current Ilim1 is expressed by the equation 7 (Ilim1=Vdet2/A/E).

When the voltage V1 becomes higher than the reference voltage Vref where the input/output voltage difference (Vin–Vout) is relatively large, the differential pair composed of the NMOS transistors 263 and 264 makes a current flow to the NMOS transistor 263. Since the PMOS transistor 260 causes a current proportional to an output current of an output transistor 120 to flow through a current mirror composed of the NMOS transistors 261 and 262, the sense current Is2 becomes a current proportional to the output current of the output transistor 120 as a consequence. As with the case of FIG. 2, at this time, a limit current Ilim2 is expressed by the equation 8 (Ilim2=Vdet2/(A+D)/E).

Here, the voltage V1 is given by an equation 10:

$$V1 = R250/R240 \times F \times (Vin-Vout) \quad (10)$$

F is a constant determined by the size ratio between the PMOS transistors 242 and 245. Since a size ratio between transistors formed on a monolithic IC is relatively high in precision as with the resistance ratio, the voltage V1 is hardly affected by variations in element characteristics. Thus, the voltage V1 makes it possible to obtain a voltage precisely proportional to the input/output voltage difference (Vin–Vout).

Since the condition for the input/output voltage difference (Vin–Vout) at which the limit current is made small is determined by the threshold value of the PMOS transistor, the voltage detection circuit 124 of FIG. 2 is affected by a temperature change in the threshold value of the transistor and variations in characteristics. In the voltage detection circuit 224 of FIG. 3, however, since the condition for the input/output voltage difference (Vin–Vout) at which the limit current is made small is determined by comparison between the voltage V1 and the reference voltage Vref, the precision of power detection can be further enhanced.

Figure 4:
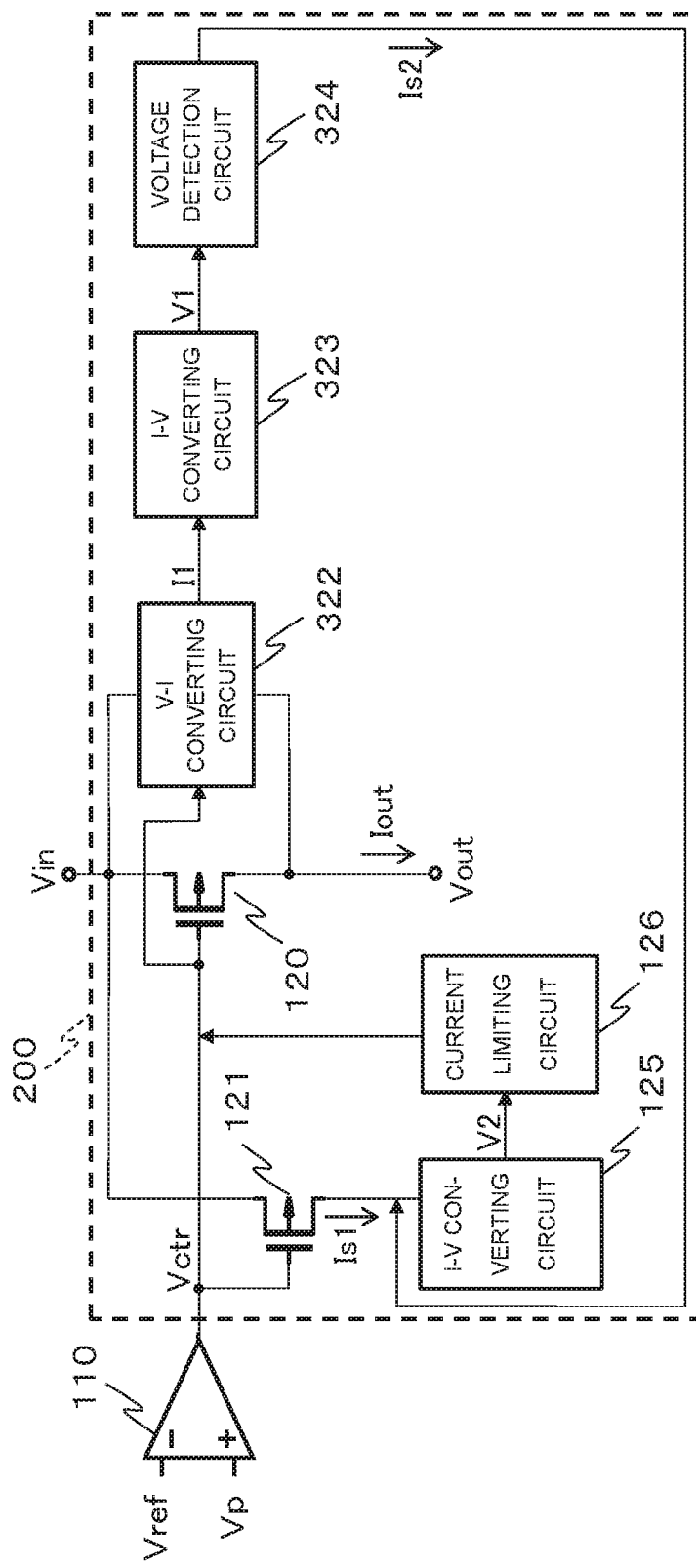
FIG. 4 is a block diagram of a voltage regulator having an overcurrent protection circuit according to a second embodiment.

FIG. 4 is a block diagram of a voltage regulator having an overcurrent protection circuit 200 according to a second embodiment.

The overcurrent protection circuit 200 is different from the overcurrent protection circuit 100 according to the first embodiment in that an output terminal of an error amplifier 110 is connected to a voltage-current converting circuit 322 (V-I converting circuit 322 in FIG. 4). A current-voltage converting circuit 323 (I-V converting circuit 323 in FIG. 4) is operated in the same manner as the current-voltage converting circuit 123.

When an output current Iout of an output transistor 120 is a prescribed value or less, the voltage-current converting circuit 322 is operated to output a current I1 proportional to the output current Iout of the output transistor 120. Thus, the current consumption of the circuit is reduced since the overcurrent protection circuit 200 is reduced in current I1 as compared with the overcurrent protection circuit 100 where a current flowing through a load connected to an output terminal of the voltage regulator is low. Accordingly, in addition to the advantageous effect of the first embodiment, there can be obtained an effect that a circuit current is suppressed to attain low power consumption of the voltage regulator.

Figure 5:
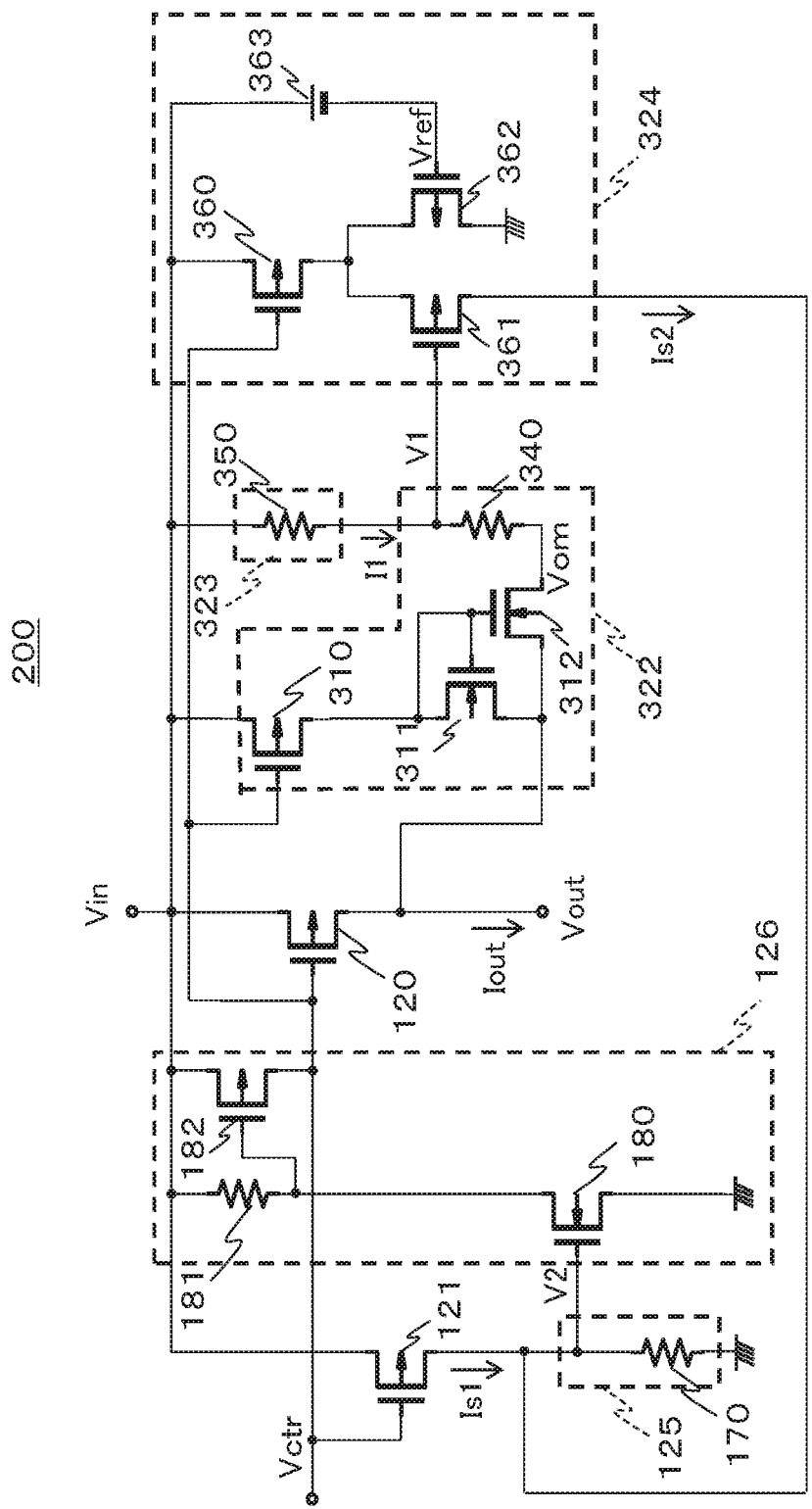
FIG. 5 is a circuit diagram illustrating one example of the overcurrent protection circuit according to the second embodiment.

FIG. 5 is a circuit diagram illustrating one example of the overcurrent protection circuit 200 according to the second embodiment.

The same parts as those in the overcurrent protection circuit 100 will not described herein.

A voltage-current converting circuit 322 has a PMOS transistor 310, NMOS transistors 311 and 312, and a resistor 340.

The PMOS transistor 310 has a source connected to an input terminal of a voltage regulator, a gate connected to a terminal Vctr, and a drain connected to a gate and a drain of the NMOS transistor 311 and a gate of the NMOS transistor 312. The NMOS transistor 311 has a source connected to an output terminal of the voltage regulator and a source of the NMOS transistor 312. The NMOS transistor 312 has a drain connected to one terminal of the resistor 340. The resistor 340 has the other terminal connected to one terminal of a resistor 350 and a gate of a PMOS transistor 361.

A voltage-current converting circuit 323 has the resistor 350.

A voltage detection circuit 324 has PMOS transistors 360, 361, and 362, and a reference voltage source 363.

The PMOS transistor 360 has a source connected to the input terminal of the voltage regulator, a gate connected to the terminal Vctr, and a drain connected to sources of the PMOS transistors 361 and 362. The PMOS transistor 361 has a drain connected to one terminal of a resistor 170. The PMOS transistor 362 has a gate connected to one terminal of the reference voltage source 363 and a drain connected to a ground terminal. The other terminal of the reference voltage source 363 is connected to the input terminal of the voltage regulator.

The PMOS transistor 310 causes a current proportional to an output current Iout of an output transistor 120 to flow through the NMOS transistor 311. The NMOS transistors 311 and 312 construct a current mirror and a current proportional to the output current Tout flows through the resistors 340 and 350.

When the output current Tout is small, the voltage generated across the resistor 350, i.e., the difference between a voltage Vin and a voltage V1 becomes small. When the voltage V1 is higher than a reference voltage Vref, a differential pair comprised of the PMOS transistors 361 and 362 causes a current to flow to the PMOS transistor 362. A sense current Is2 supplied from the PMOS transistor 361 becomes zero, and hence only a sense current Is1 flows through the resistor 170. Thus, when the output current Iout is relatively small, a limit current Ilim1 becomes a value expressed by the equation 7 (Ilim1=Vdet2/A/E) regardless of the magnitude of the input/output voltage difference (Vin−Vout).

Since the current flowing through PMOS transistor 310 becomes relatively large when the output current Iout is relatively large, the on resistance of the NMOS transistor 312 becomes relatively small. When the on resistance of the NMOS transistor 312 becomes relatively small, a drain voltage Vom of the NMOS transistor 312 becomes substantially equal to the voltage Vout of the output terminal, and the voltage equivalent to the input/output voltage difference (Vin−Vout) is applied across a series resistor of the resistors 350 and 340. Hence, a current I1 supplied from the voltage-current converting circuit 322 becomes a current value proportional to the input/output voltage difference (Vin−Vout). Accordingly, when the output current Iout is relatively large, the current expressed by the equation 3 is supplied from the voltage-current converting circuit 322. The voltage V1 supplied from the current-voltage converting circuit 323 is generated across the resistor 350 and is as given by the equation 4 (V1=C×I1).

When the output current Tout is relatively large, and the input/output voltage difference (Vin−Vout) is relatively small, the voltage V1 is higher than the reference voltage Vref supplied from the reference voltage source 363. Accordingly, the differential pair comprised of the PMOS transistors 361 and 362 causes a current to flow to the PMOS transistor 362. Then, the sense current Is2 supplied from the PMOS transistor 361 becomes zero, and only the sense current Is1 flows through the resistor 170. At this time, the limit current Ilim1 is expressed by the equation 7 (Ilim1=Vdet2/A/E).

When the output current Tout is relatively large, and the input/output voltage difference (Vin−Vout) is relatively large, the voltage V1 becomes lower than the reference voltage Vref. Accordingly, the differential pair composed of the PMOS transistors 361 and 362 causes a current to flow to the PMOS transistor 361. Then, the PMOS transistor 361 outputs a current proportional to the output current Tout supplied from the PMOS transistor 360 as the sense current Is2. At this time, a limit current Ilim2 is expressed by the equation 8 (Ilim2=Vdet2/(A+D)/E).

By designing the PMOS transistor 310, the NMOS transistors 311 and 312, and the resistors 340 and 350 so that the current I1 can be reliably supplied with respect to the output current Iout of the output transistor 120, which limits an overcurrent, an overcurrent protective operation similar to that of the first embodiment is enabled.

Further, the voltage-current converting circuit 322 is configured to consume the circuit current only when the output current Tout is relatively large. Accordingly the overcurrent protection circuit 200 is capable of reducing the circuit current when the load current of the load is small, and the output current Iout of the output transistor 120 is small.

Incidentally, in the overcurrent protection circuit 200 of FIG. 5, the constant D in the equation 5 is determined by a size ratio between the output transistors 120 and 360.

Figure 6:
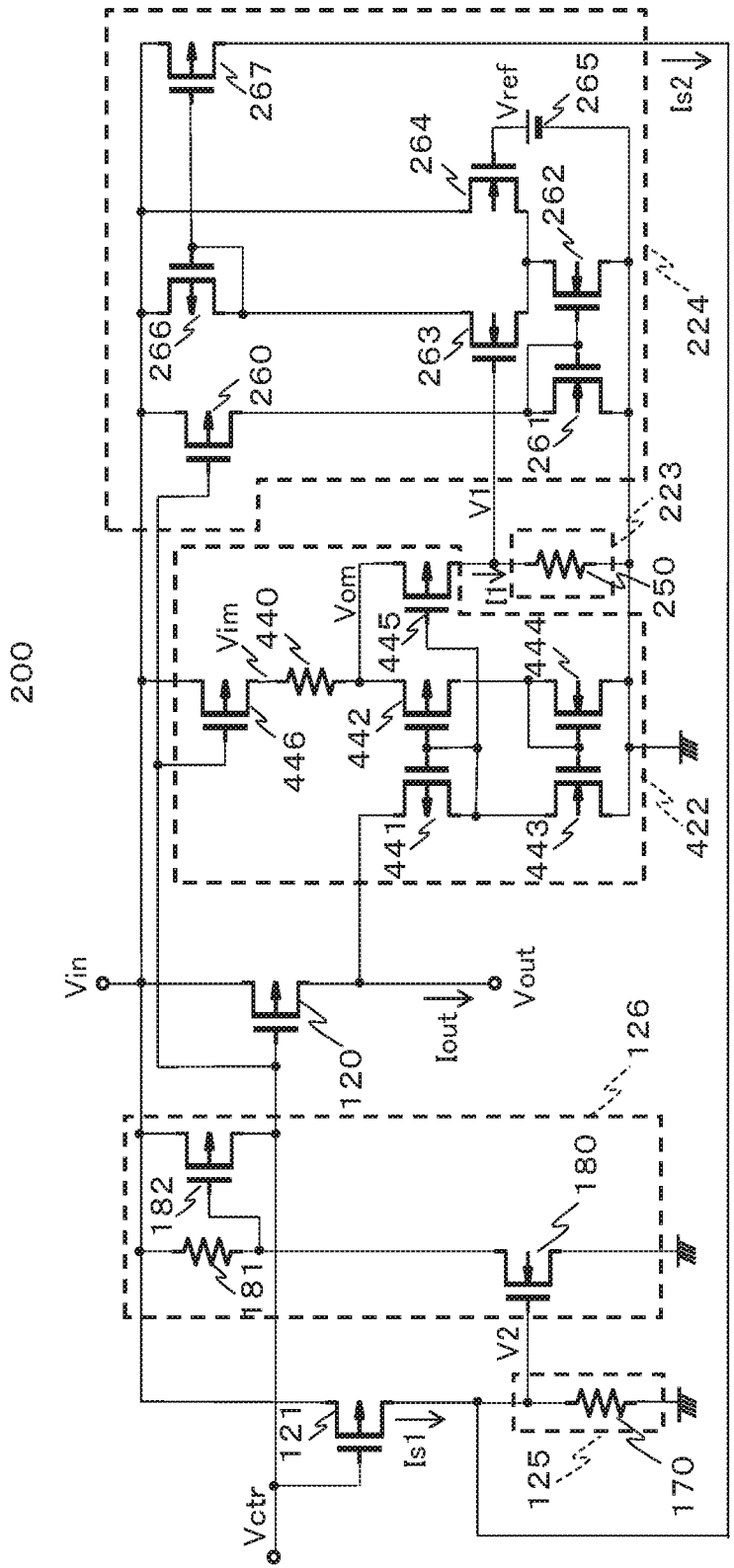
FIG. 6 is a circuit diagram illustrating another example of the overcurrent protection circuit according to the second embodiment.
Figure 7:
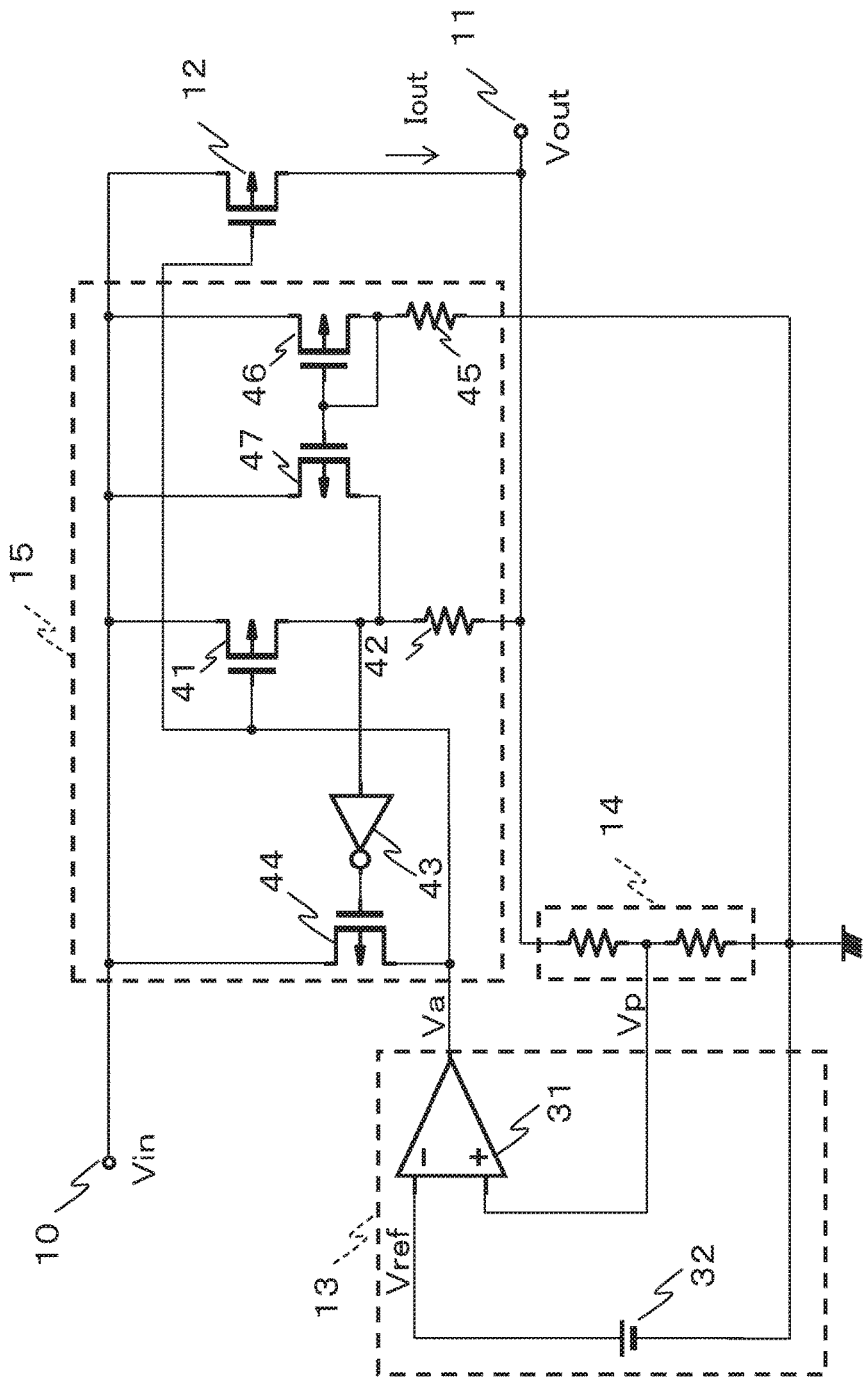
FIG. 7 is a circuit diagram of a voltage regulator having a related art overcurrent protection circuit.

FIG. 6 is a circuit diagram illustrating another example of the overcurrent protection circuit 200 according to the second embodiment.

In the overcurrent protection circuit 200 of FIG. 6, the same parts as those in the first and second embodiments will not be described.

A voltage-current converting circuit 422 has PMOS transistors 441, 442, 445, and 446, NMOS transistors 443 and 444, and a resistor 440.

The PMOS transistor 441 has a source connected to an output terminal of a voltage regulator and a gate and a drain connected to a gate of the PMOS transistor 442, a gate of the PMOS transistor 445, and a drain of the NMOS transistor 443. The NMOS transistor 443 has a source connected to a ground terminal and a gate connected to a gate and a drain of the NMOS transistor 444 and a drain of the PMOS transistor 442. The NMOS transistor 444 has a source connected to the ground terminal. The PMOS transistor 442 has a source connected to one terminal of the resistor 440 and a source of the PMOS transistor 445. The other terminal of the resistor 440 is connected to a drain of the PMOS transistor 446. The PMOS transistor 445 has a drain connected to one terminal of a resistor 250 and a gate of an NMOS transistor 263. The PMOS transistor 446 has a gate connected to a terminal Vctr and a source connected to an input terminal of the voltage regulator.

The PMOS transistors 441, 442, and 445, the NMOS transistors 443 and 444, and the resistor 440 are identical in configuration to those of the voltage-current converting circuit 222 and are operated in the same manner. The PMOS transistor 446 causes a current proportional to an output current Iout of an output transistor 120 to flow through the resistor 440. A current proportional to the output current Iout thus flows through a resistor 250.

When the output current Iout is small, the voltage V1 generated across the resistor 250 becomes low. When the voltage V1 is lower than a reference voltage Vref, a differential pair comprised of the NMOS transistors 263 and 264 causes a current to flow to the NMOS transistor 264. Then, a sense current Is2 supplied from a current mirror comprised of PMOS transistors 266 and 267 becomes zero, and hence only a sense current Is1 flows through a resistor 170. Thus, since a voltage detection circuit 224 does not output the sense current Is2 regardless of the magnitude of an input/output voltage difference (Vin−Vout) when the output current Iout is small, a limit current becomes a value expressed by the equation 7 (Ilim1=Vdet2/A/E).

Since the current flowing through the PMOS transistor 446 becomes large when the output current Iout is large, the on resistance of the PMOS transistor 446 becomes small. When the on resistance of the PMOS transistor 446 becomes small, a drain voltage Vim of the PMOS transistor 446 becomes substantially equal to the voltage Vin of the input terminal. Since the voltage equivalent to the input/output voltage difference (Vin−Vout) is applied across the resistor 440, the current flowing through the PMOS transistors 442 and 445 becomes a current value proportional to the input/output voltage difference (Vin−Vout). Thus, when the output current Iout is relatively large, a current I1 expressed by the equation 3 (I1=B×(Vin−Vout)) is supplied from the voltage-current converting circuit 422.

The voltage-current converting circuit 223 outputs the voltage V1 given by the equation 4 (V1=C×I1) which is generated across the resistor 250. Assuming that the resistance value of the resistor 440 is R440, the constant B in the equation 3 becomes 1/R440. Further, assuming that the resistance value of the resistor 250 is R250, the constant C in the equation 4 is determined depending on the resistance value R250 and a size ratio between the PMOS transistors 442 and 445.

When the output current Tout is relatively large, and the input/output voltage difference (Vin−Vout) is relatively small, the voltage V1 is lower than the reference voltage Vref supplied from a reference voltage source 265. On the other hand, when the output current Iout is relatively large, and the input/output voltage difference (Vin−Vout) is relatively large, the difference between the voltage Vin and the voltage V1 becomes higher than the reference voltage Vref. The operation of a voltage detection circuit 224 corresponding to the magnitude of the voltage V1 is as described in FIG. 3.

By designing the PMOS transistor 446 and the resistor 440 so that the current I1 can be reliably supplied with respect to the output current Tout of the output transistor 120, which limits an overcurrent, an overcurrent protective operation similar to that of the first embodiment is enabled.

Further, in the voltage-current converting circuits 122 and 222 of the first embodiment, the circuit current flows between the input terminal and the ground terminal when the input/output voltage difference (Vin–Vout) is relatively large, whereas the voltage-current converting circuit 422 of the second embodiment is configured to consume a circuit current only when the output current Iout is relatively large. Accordingly, when the output current Iout is small, the circuit current of the overcurrent protection circuit 200 can be suppressed as with the overcurrent protection circuit 200 of FIG. 5.

As described above, when using the overcurrent protection circuit 200 according to the second embodiment, a low power consumption overcurrent protection circuit can be realized in addition to an effect similar to that of the overcurrent protection circuit 100 according to the first embodiment.

Incidentally, the present invention is not limited to the configurations illustrated in the embodiments. It is needless to say that various changes may be made thereto within the scope not departing from the gist of the present invention. For example, the resistor may be comprised of an impedance element having a function similar thereto.

What is claimed is:

1. An overcurrent protection circuit, comprising:
a sense transistor through which a first sense current proportional to an output current of an output transistor flows;
a voltage-current converting circuit connected between an input terminal of the output transistor and an output terminal thereof, and configured to output a first current;
a first current-voltage converting circuit configured to output a first voltage proportional to the first current;
a voltage detection circuit configured to detect the first voltage and to output a second sense current proportional to the output current of the output transistor;
a second current-voltage converting circuit through which the first sense current and the second sense current flow; and
a current limiting circuit configured to limit the output current of the output transistor based on a second voltage supplied from the second current-voltage converting circuit,
wherein the voltage-current converting circuit includes a first resistive element to which a voltage equal to the voltage difference between the input and output terminals of the output transistor is applied,
wherein the voltage-current converting circuit outputs the first current inversely proportional to a resistance value of the first resistive element, and
wherein the first current-voltage converting circuit includes a second resistive element and outputs the first voltage proportional to a resistance value of the second resistive element and the first current.

2. The overcurrent protection circuit according to claim 1, wherein the voltage-current converting circuit outputs the first current proportional to a voltage difference between the input terminal of the output transistor and the output terminal of the output transistor.

3. The overcurrent protection circuit according to claim 1, wherein the voltage-current converting circuit outputs the first current proportional to the output current of the output transistor according to a magnitude of the output current of the output transistor.

4. The overcurrent protection circuit according to claim 1, wherein the voltage detection circuit includes a third transistor which makes a current proportional to the output current of the output transistor to flow, and
wherein the voltage detection circuit outputs the second sense current proportional to an output current of the third transistor according to detection by the voltage detection circuit that the first voltage is greater than or equal to a prescribed voltage.

5. A voltage regulator comprising:
the overcurrent protection circuit according to claim 1;
the output transistor configured to output an output voltage; and
an error amplifier configured to control the output transistor in such a manner that the output voltage becomes a desired voltage.

6. The overcurrent protection circuit according to claim 2, wherein the voltage-current converting circuit outputs the first current proportional to the output current of the output transistor according to a magnitude of the output current of the output transistor.

7. The overcurrent protection circuit according to claim 2, wherein the voltage detection circuit includes a third transistor which makes a current proportional to the output current of the output transistor to flow, and
wherein the voltage detection circuit outputs the second sense current proportional to an output current of the third transistor according to detection by the voltage detection circuit that the first voltage is greater than or equal to a prescribed voltage.

8. A voltage regulator comprising:
the overcurrent protection circuit according to claim 2;
the output transistor configured to output an output voltage; and
an error amplifier configured to control the output transistor in such a manner that the output voltage becomes a desired voltage.

9. The overcurrent protection circuit according to claim 3, wherein the voltage detection circuit includes a third transistor which makes a current proportional to the output current of the output transistor to flow, and
wherein when the voltage detection circuit detects that the first voltage is greater than or equal to a prescribed voltage, the voltage detection circuit outputs the second sense current proportional to an output current of the third transistor.

10. A voltage regulator comprising:
the overcurrent protection circuit according to claim 3;
the output transistor configured to output an output voltage; and
an error amplifier configured to control the output transistor in such a manner that the output voltage becomes a desired voltage.

* * * * *